United States Patent [19]

Tanaka et al.

[11] Patent Number: 5,240,904

[45] Date of Patent: * Aug. 31, 1993

[54] PROCESS FOR PREPARING A-AXIS ORIENTED SUPERCONDUCTING OXIDE THIN FILMS

[75] Inventors: Saburo Tanaka; Hidenori Nakanishi; Hideo Itozaki, all of Hyogo, Japan

[73] Assignee: Sumitomo Electric Industries, Ltd., Osaka, Japan

[*] Notice: The portion of the term of this patent subsequent to Sep. 29, 2009 has been disclaimed.

[21] Appl. No.: 707,798

[22] Filed: May 30, 1991

[30] Foreign Application Priority Data

May 30, 1990 [JP] Japan .................................. 2-140515

[51] Int. Cl.$^5$ ................................................ B05D 5/12
[52] U.S. Cl. ........................................ 505/1; 505/731; 505/732; 505/730; 427/62; 427/596; 427/419.3; 427/419.2; 427/126.3; 427/314; 204/192.24
[58] Field of Search ................... 505/1, 731, 732, 730; 427/62, 63, 126.3, 53.1, 54.1, 314, 419.3, 419.2, 596; 204/192.24

[56] References Cited

PUBLICATIONS

Eom et al, "Epitaxial and Smooth Films of a-Axis $YBa_2Cu_3O_7$" Science, vol. 249, Sep. 1990 pp. 1549-1552.

Gander et al, "Optimization of Yttrium Barium Copper Oxide Surfaces for Tunnel Junctions", IEEE Trans. Magn., 25(2) 1989, pp. 803-805.

*Primary Examiner*—Roy King
*Attorney, Agent, or Firm*—Kerkam, Stowell, Kondracki & Clarke

[57] ABSTRACT

Improvement in a process for preparing a-axis oriented thin film of high-Tc oxide superconducting material by laser evaporation method. Before the a-axis oriented thin film of oxide superconducting material is deposited by laser evaporation method, an under-layer having an a-axis orientation of the crystal of the same oxide superconducting material is deposited on a substrate previously by sputtering.

9 Claims, 1 Drawing Sheet

PROCESS FOR PREPARING A-AXIS ORIENTED SUPERCONDUCTING OXIDE THIN FILMS

BACKGROUND OF THE INVENTION

1. Field of the Invention

The present invention relates to a process for preparing high-temperature superconducting thin films, more particularly to a process for preparing thin films of high-temperature oxide superconductors possessing improved crystallinity and electrical properties on a substrate.

The term high-temperature oxide superconductor means new type oxide superconductors possessing the critical temperature (Tc) of higher than 30 K such as Y-Ba-Cu oxide, Bi-Sr-Ca-Cu oxide, Ti-Ba-Ca-Cu oxide or the like.

2. Description of the Related Art

These new type high-temperature superconductors are expected to be utilized to fabricate electronics devices such as Josephson element, superconducting transistors or the like. In order to realize these electronics devices, it is indispensable to prepare their thin films.

It is known that these high-temperature oxide superconductors show anisotropy in their superconducting properties. In fact, their crystals show higher critical current density (Jc) along a direction which is perpendicular to c-axis than the other directions, namely a-axis and b-axis. Therefore, a variety of studies have been made to prepare c-axis oriented thin films of the oxide superconductors in which electric current flows mainly in parallel with a surface of the thin film. Today, such c-axis oriented single crystal thin films of high quality can be prepared by sputtering, vacuum-evaporation, laser abrasion technique or the like on single crystal substrates such as $SrTiO_3$ and MgO.

The high-temperature superconductors exhibit anisotropy in their coherent length also. Namely, the coherent length along the a-axis is longer than that of along the c-axis. In fact, the coherent length along the c-axis is several angstroms (Å) while the coherent length along the a-axis is several ten angstroms (10 Å). In certain applications of oxide superconductors such as electronics devices, for example Josephson Junctions, the a-axis oriented thin films possessing such longer coherent length are requested.

The "a-axis oriented thin film" means thin films made of crystal whose a-axis is substantially perpendicular to a surface of the thin film.

It is known that such a-axis oriented thin films of oxide superconductors can be prepared or realized, for example by sputtering, under such a condition that a substrate on which the thin film is deposited is heated at a temperature which is lower by about 10° C. than a temperature which is requested to realize the c-axis oriented thin film. The crystallinity of the resulting thin film of oxide superconductor, however, is spoiled when the substrate temperature is lowered because oxygen supply into the crystal becomes insufficient. Therefore, the a-axis oriented thin films of oxide superconductors prepared by methods known in the prior art show relatively poor electrical properties.

In the case of techniques other than sputtering, it is difficult to prepare the a-axis oriented thin films of oxide superconductors directly on a substrate even if the substrate temperature is controlled or lowered. Particularly, it is very difficult to prepare the a-axis oriented thin films of oxide superconductors directly on a substrate by vacuum-evaporation, although the vacuum-evaporation technique has many advantages, including that a composition in the thin film can be controlled easily and a thin film of large area can be prepared at relatively higher deposition rate.

The inventors of the present application proposed, in a copending U.S. Pat. application Ser. No. 07/668,263 now U.S. Pat. No. 5,151,408, a process for preparing an a-axis oriented thin film of oxide superconductor possessing improved electrical properties by vacuum-evaporation technique by interposing another a-axis oriented intermediate layer between the a-axis oriented thin film and a substrate.

Now, the inventors of the present application found that the same technique as is disclosed in the U.S. Pat. application Ser. No. 07/668,263 is applicable to prepare an a-axis oriented thin film of oxide superconductor by the laser evaporation method which has advantages that thin film can be prepared rapidly in the absence of electromagnetic field and that deposition conditions can be controlled easily compared to the other techniques.

Although the laser evaporation method itself is known and is used for preparing thin films of superconducting oxides, it has been difficult to prepare the a-axis oriented thin films of oxide superconductors directly on a substrate by the laser evaporation method because of the same reason as above.

Therefore, an object of the present invention is to provide a process for preparing the a-axis oriented thin films of oxide superconductors possessing improved electrical properties by the laser evaporation method.

SUMMARY OF THE INVENTION

The present invention provides a process for preparing an a-axis oriented thin film of oxide superconducting material possessing improved crystallinity and electrical properties by laser evaporation method, characterized in that an under-layer of the oxide superconducting material having an a-axis orientation of crystal is deposited firstly on a substrate by any deposition technique other than laser evaporation method under such a deposition condition as is suitable to realize the a-axis oriented thin film, and then an upper layer of the same oxide superconducting material is secondly deposited on the resulting under-layer by laser evaporation method under another deposition condition which is most suitable for the laser evaporation method.

The "laser evaporation method" means a deposition technique in which a target is irradiated by a high-energy laser beam so that elements of the target are evaporated instantaneously and the resulting evaporated elements are deposited on a substrate. So-called laser abrasion method is a typical technique of the laser evaporation method.

In a preferred embodiment of the process according to the present invention, the under-layer of same oxide superconducting material can be deposited on a substrate by any deposition technique other than laser evaporation method, preferably prepared by sputtering method, under such a condition that the substrate is heated at a temperature which is suitable to realize an a-axis orientation of crystal of the oxide superconducting material before the upper-layer of the same oxide superconducting material is deposited on a surface of the resulting underlayer under by the laser evaporation method.

The "temperature which is suitable to realize an a-axis orientation of crystal of the oxide superconducting material" means a temperature at which the a-axis of crystals of which the thin film of the oxide superconducting material is made to grow preferentially or predominantly along a direction perpendicularly to a surface of the substrate. Generally, such a-axis oriented thin films of oxide superconductors can be realized by physical vapour deposition technique such as sputtering under such a condition that a substrate on which the thin film is deposited is heated at a temperature which is lowered by about 10° C. than a temperature which is requested to realize the c-axis oriented thin film of the same material. For example, in the case that a-axis oriented thin films of Y-Ba-Cu-O type oxide superconductors are produced by sputtering, the substrate must be heated at a temperature between 530° and 620° C.

The term "sputtering" includes all variations thereof such as DC sputtering, RF sputtering, RF-magnetron sputtering or the like.

The under-layer has preferably a thickness of 20 to 1,000 Å. If the thickness is not thicker than 20 Å, it is difficult to obtain desired a-axis oriented upper-layer on the under-layer. Thicker thin film over 1,000 Å may not improve substantially the properties of the upper-layer. The thickness of the upper-layer is preferably above 100 Å.

In the process according to the present invention, the upper-layer is produced by laser evaporation method. In this case, a substrate having an under-layer which has been prepared previously can be heated at a temperature which is higher by 10° to 100° C. than a temperature which is used to prepare the under-layer. The substrate temperature for preparing the upper layer may be a temperature at which the c-axis oriented thin film usually grows directly on the same substrate.

An important advantage of this embodiment of the present invention resides in that the a-axis oriented upper-layer of oxide superconducting material can be prepared by using a higher substrate temperature which corresponds to a temperature for realizing the c-axis oriented thin film directly on a substrate and which has not been able to be used to prepare the a-axis oriented thin film by laser evaporation method. In other words, in the process according to the present invention, an upper-layer of a-axis oriented thin film can be grown on an under-layer which is also a-axis oriented thin film, at optimum substrate temperature which is indispensable to supply a sufficient amount of oxygen into the crystals in order to prepare an oxide superconducting thin film possessing improved crystallinity and electrical properties on a substrate. This advantageous result is obtained by such a fact that the upper-layer grows in a form of an a-axis oriented thin film on an under-layer even if film formation is effected at a relatively higher substrate temperature, because crystal growth of the upper-layer is effected on a crystal structure of the under-layer which has been prepared in a form of an a-axis oriented thin film.

The substrate is preferably a single crystal substrate of oxide such as MgO, $SrTiO_3$, $LaAlO_3$, $LaGaO_3$ and yttrium stabilized zirconia (YSZ).

The process according to the present invention can be used for preparing thin films of any high-temperature oxide material and is advantageously applicable to oxide superconducting materials of the Y-Ba-Cu-O system and the Bi-Sr-Ca-Cu-O system compositions of which, as well as their manufacturing processes, are known.

The process according to the present invention has the following advantages:

(1) The laser evaporation method can be used for preparing an a-axis oriented thin film of high-temperature oxide superconductor. The laser evaporation method has the important advantage that proportions of elements in a deposited thin film can be maintained much more uniformly as compared to a product prepared by vacuum evaporation method in which a plurality of evaporation sources are evaporated instantaneously by the laser evaporation method.

(2) The process according to the present invention can be carried out by changing simply the substrate temperature without modifying the conventional laser evaporation apparatus.

(3) The resulting thin films obtains by the process according to the present invention possess uniform quality and improved superconducting properties, so that they can be utilized in practical uses in the field of electronics of high-temperature oxide superconductors.

Figure 1:
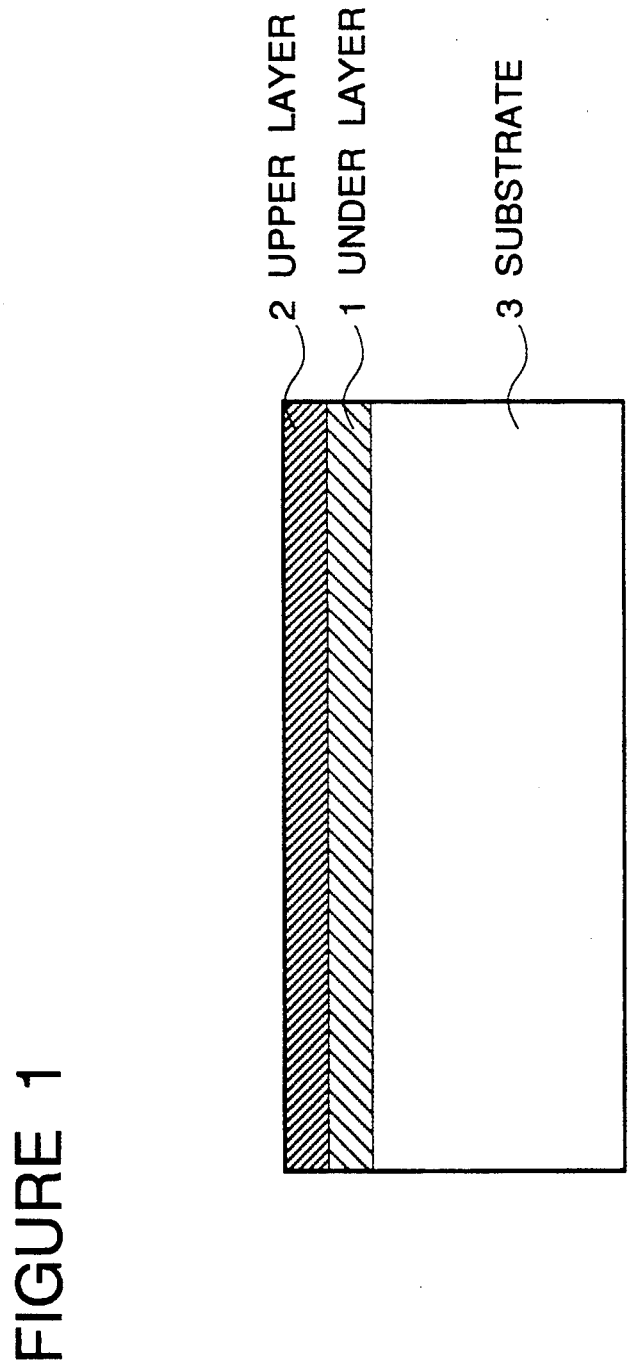
FIG. 1 is a diagrammatical cross sectional view of a product obtained by the process according to the present invention.

A thin film of high-temperature oxide superconducting material which is illustrated in FIG. 1 and as is prepared in Examples was prepared by depositing an under-layer 1 on a substrate 3 of MgO (100) single crystal by RF-magnetron sputtering and then by depositing an upper-layer 2 of the same high-temperature oxide superconducting material on the under-layer 1.

DESCRIPTION OF THE PREFERRED EMBODIMENTS

Now, the present invention will be described with reference to examples, but the scope of the present invention should not be limited thereto.

EXAMPLE 1

In this Example, an under-layer of a-axis oriented thin film of Y-Ba-Cu-O oxide superconducting material was deposited on MgO (100) single crystal by RF-magnetron sputtering and then an upper-layer of the same Y-Ba-Cu-O oxide superconducting material was deposited thereon by laser deposition method.

In the RF-magnetron sputtering used for preparing the under-layer, a sintered oxide target having a composition of Y:Ba:Cu=1:2:3 was used. Operational conditions used for preparing the under-layer are summarized in Table 1.

TABLE 1

| | |
|---|---|
| Substrate temperature (°C.) | 620 |
| Gas pressure (Torr) | 0.1 |
| Sputtering gas $O_2/(Ar + O_2)$ (%) | 80 |
| High-frequency power (W/cm$^2$) | 0.51 |
| Deposition rate (Å/sec) | 0.3 |
| Film thickness (Å) | 100 |

Then, on the resulting under-layer of Y-Ba-Cu-O oxide superconducting material, an upper-layer of same Y-Ba-Cu-O oxide superconducting material was deposited by laser evaporation method in the same chamber.

In the laser evaporation method used for preparing the upper-layer the same sintered mass having a composition of Y:Ba:Cu=1:2:3 was used as a target. Operational conditions used are summarized in Table 2.

TABLE 2

| | |
|---|---|
| Substrate temperature (°C.) | 620 |
| Gas pressure (Torr) | 0.5 |
| $O_2$ gas (sccm) | 0.5 |
| Laser power (J/cm$^2$) | 1.5 |
| Deposition rate (Å/sec) | 4 |
| Film thickness (Å) | 3,000 |

After deposition, superconducting properties of the resulting thin film of oxide superconducting was determined to find Tc of 89 K.

Crystallinity of the resulting upper-layer prepared by the present invention was analyzed by a reflective high energy electron diffraction (RHEED) analyzer to find that a long distance structure of the c-axis direction appeared in a direction which is perpendicular to an incident beam. This fact reveals that the resulting upper-layer is an a-axis oriented thin film

EXAMPLE 2

Example 1 was repeated, but the Y-Ba-Cu-O target was changed to a sintered oxide target having a composition of Bi:Sr:Ca:Cu=2:2:2:3. Operational conditions used for preparing the under-layer are summarized in Table 3.

TABLE 3

| | |
|---|---|
| Substrate temperature (°C.) | 640 |
| Gas Pressure (Torr) | 0.1 |
| Sputtering gas $O_2/(Ar + O_2)$ (%) | 80 |
| High-frequency power (W/cm$^2$) | 0.51 |
| Deposition rate (Å/sec) | 0.3 |
| Film thickness (Å) | 100 |

Then, on the resulting under-layer of oxide superconducting thin film, a thin film of oxide superconductor was prepared by laser evaporation method. As a target, a sintered mass having a composition of Bi:Sr:Ca:Cu=2:2:2:3. Operational conditions used for preparing the under-layer are summarized in Table 4.

TABLE 4

| | |
|---|---|
| Substrate temperature (°C.) | 640 |
| Gas pressure (Torr) | 0.5 |
| $O_2$ gas (sccm) | 0.3 |
| Laser power (J/cm$^2$) | 1.5 |
| Deposition rate (Å/sec) | 4 |
| Film thickness (Å) | 3,200 |

After the deposition, superconducting properties of the resulting thin film of oxide superconducting was determined to find Tc of 101 K.

Crystallinity of the resulting upper-layer prepared by the present invention was analyzed by a reflective high energy electron diffraction (RHEED) analyzer to find that a long distance structure of the c-axis direction appeared in a direction which is perpendicular to an incident beam.

From the facts, it was revealed that the high-temperature superconducting thin films are an a-axis oriented thin films possessing improved superconductivity.

We claim:

1. A process for preparing an a-axis oriented film of oxide superconducting material by laser evaporation method, which comprises the steps of depositing firstly an under-layer of the oxide superconducting material having an a-axis crystal orientation and having a thickness between about 20 to 1,000 Å on a substrate by a physical vapor deposition technique other than laser evaporation method at a substrate temperature which is lower by more than about 10° C. than a substrate temperature which is required to realize a c-axis oriented film of the same material, and then secondly depositing an upper layer of the same oxide superconducting material on the resulting under-layer by laser evaporation method.

2. The process set forth in claim 1 wherein said upper-layer has a thickness of more than 100 Å.

3. The process set forth in claim 1 wherein said under-layer is produced by sputtering method.

4. The process set forth in claim 3 wherein said sputtering method is RF sputtering.

5. The process set forth in claim 1 wherein said substrate is a single crystal substrate of oxide.

6. The process set forth in claim 5 wherein said substrate is selected from the group consisting of MgO, SrTiO$_3$, LaAlO$_3$, LaGaO$_3$ and yttrium stabilized zirconia (YSZ).

7. The process set forth in claim 1 wherein said oxide superconducting material is compound oxides of Y-Ba-Cu-O system or Bi-Sr-Ca-Cu-O system.

8. The process set forth in claim 1 wherein said under-layer of the oxide superconducting material is deposited under such a condition that said substrate is heated at a temperature which is suitable to realize an a-axis orientation of crystal of said oxide superconducting material in a first step followed by a second step in which said upper-layer of the oxide superconducting material is deposited under such a condition that said substrate is heated at a temperature which is higher by 10° to 100° C. than said temperature which is used in the first step.

9. The process set forth in claim 7 wherein said upper-layer of the oxide superconducting material is deposited under such a condition that said substrate is heated to a temperature corresponding to a temperature at which c-axis oriented film is prepared when the same film is deposited directly on said substrate.

* * * * *